United States Patent
Tian et al.

(10) Patent No.: US 6,541,400 B1
(45) Date of Patent: Apr. 1, 2003

(54) PROCESS FOR CVD DEPOSITION OF FLUORINATED SILICON GLASS LAYER ON SEMICONDUCTOR WAFER

(75) Inventors: Jason L. Tian, Milpitas, CA (US); Harald Te Nijenhuis, Fremont, CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 09/501,347

(22) Filed: Feb. 9, 2000

(51) Int. Cl.⁷ .................. H01L 21/31; H01L 21/469; H05H 1/02; H05H 1/24
(52) U.S. Cl. .................. 438/784; 438/788; 427/574; 427/579
(58) Field of Search .................. 438/783, 784, 438/787, 788; 427/574, 578, 579

(56) References Cited

U.S. PATENT DOCUMENTS

| | | | |
|---|---|---|---|
| 5,563,105 A | | 10/1996 | Dobuzinsky et al. ........ 437/240 |
| 5,571,576 A | * | 11/1996 | Qian et al. ................. 427/574 |
| 5,827,785 A | | 10/1998 | Bhan et al. ................. 438/784 |
| 5,880,018 A | * | 3/1999 | Boeck et al. ............... 438/619 |
| 6,001,728 A | * | 12/1999 | Bhan et al. ................. 438/624 |
| 6,057,250 A | * | 5/2000 | Kirchhoff et al. ........... 438/784 |
| 6,077,764 A | * | 6/2000 | Sugiarto et al. ............ 438/597 |
| 6,165,915 A | * | 12/2000 | Jang ........................... 438/787 |

FOREIGN PATENT DOCUMENTS

JP  7-254592  * 10/1995

OTHER PUBLICATIONS

T. Fukuda et al., Highly Reliable SiOF Film Formation by ECR–CVD Using $SiF_2H_2$, Tech. Digest 1996 symp. On VLSI Tech., p. 114–115 (1996).

T. Fukuda et al., Highly Reliable SiOF Film Formation by ECR–CVD Using $SiF_2H_2$, Tech. Digest on 1996 symp. On VLSI Tech., p. 114–115 (1996).

Shapiro et al., "CVD of Fluorosilicate Glass For ULSI Applications," Elsevier science S.A., 1995, pp. 503–507.

Laxman, "Low $\epsilon$ Dielectrics: CVD Fluorinated Silicon Dioxides," Semiconductor International, vol. 18, No. 5, May 1995, pp. 71–74.

Singer, "Low $\kappa$ Dielectrics: The Search Continues," Semiconductor International, vol. 19, No. 3, May 1996, pp. 88–96.

T. Tamura et al., Ext. Abstracts 43th Spring Meeting; The Japan Soc. Appl. Phys. And Related Soc., p. 658 (1996) (without English Translation).

T. Fukuda et al., Highly Reliable SiOF Film Formation by ECR–CVD Using $SiF_2H_2$, Tech. Digest 1996 symp. On VLSI Tech., pp. 114–115 (1996).

* cited by examiner

Primary Examiner—Olik Chaudhuri
Assistant Examiner—Erik Kielin
(74) Attorney, Agent, or Firm—Skjerven Morrill LLP

(57) ABSTRACT

An improved process for depositing a robust fluorosilicate glass film on a substrate in a chamber includes maintaining a total pressure in the chamber of less than about 1.7 torr, introducing vapor phase chemicals such as $N_2$, $SiF_4$, $SiH_4$, and $N_2O$ into the chamber, and reacting the vapor-phase chemicals with sufficiently supplied energy to deposit a thin film layer of the fluorosilicate glass on the substrate. Advantageously, the deposited fluorosilicate glass films are chemically, mechanically, and thermally stable without additional processing. Also advantageously, the films are deposited uniformly at rates greater than about 5000 Angstroms per minute with dielectric constants of about 3.4 to about 3.9.

22 Claims, 6 Drawing Sheets

PROCESS FOR CVD DEPOSITION OF FLUORINATED SILICON GLASS LAYER ON SEMICONDUCTOR WAFER

BACKGROUND

1. Field of the Invention

The present invention is related to methods of forming dielectrics of the type used in semiconductor VLSI applications, and more particularly to improved processes for forming low-dielectric constant fluorinated silicon glass layers having improved characteristics.

2. Description of the Related Art

Capacitive coupling between metal features in an integrated circuit increases in inverse proportion to the distance between the metal features. As the typical metal feature size in integrated circuits decreases with each new generation of circuits, the spacing between metal features in the circuits also decreases. Consequently, as integrated circuits increase in complexity and shrink in size, capacitive coupling between metal features increases in magnitude. The resistance-capacitance (RC) signal delays associated with capacitive coupling similarly grow in magnitude, and degrade the performance of the circuits.

Since capacitance is directly proportional to the dielectric constant (k), RC problems in integrated circuits can be reduced if low dielectric-constant materials are used as the insulating material. Silicon dioxide ($SiO_2$) has long been used as a dielectric for integrated circuits because of its excellent mechanical and thermal stability and relatively good dielectric properties (k~4.0). However, industry now requires materials with dielectric constants less than that of silicon dioxide for use as intermetal and interlevel dielectrics in modern integrated circuits.

Fluorosilicate glass (FSG) has been identified as a very promising low dielectric constant material for use in integrated circuits. Incorporation of fluorine, a very electronegative atom, into a silicon oxide layer decreases the polarizability and hence the dielectric constant of the layer. Further increasing the fluorine content of the silicon oxide layer generally further decreases the dielectric constant.

Fluorosilicate glass dielectric layers in integrated circuits are simply deposited using chemical vapor deposition (CVD) and plasma enhanced chemical vapor deposition (PECVD) processes as disclosed, for example, in U.S. Pat. Nos. 5,563,105 and 5,827,785. Typically, a mixture of reactant such as tetraethoxysilane (TEOS), $SiF_4$, $SiH_4$, $F_2$, $N_2O$, and $O_2$ is introduced into a CVD chamber and excited by a radio frequency (RF) electric field to create ions or radicals which recombine on the substrate surfaces to give the desired FSG film.

Typically, conventional process recipes for the deposition of FSG films, including RF power, choice of reactant gas concentrations, and total pressure, were initially chosen as variations on the baseline process recipes for deposition of silicon oxide films and then improved by experimentation. For example, in some conventional process recipes for PECVD FSG film deposition the total pressure in the CVD chamber was initially chosen to be ~2.4 torr to match a recipe for PECVD silicon oxide film deposition, and then raised to ~2.7 torr to improve the film deposition rate and the film uniformity and to decrease the dielectric constant.

Unfortunately, conventionally deposited FSG films are typically mechanically, chemically, and thermally unstable. For example, loosely bound fluorine atoms in the lattice structure of some FSG films result in the films having a tendency to absorb water. The absorbed water increases the dielectric constant of the film and reacts with fluorine to form corrosive HF. The HF and absorbed water typically outgas during thermal processes, such as anneal processes, and degrade the adhesion properties of the FSG film. For example, outgassing HF and water can cause blister and bubble formation in subsequently deposited metal or dielectric layers.

Some conventionally deposited unstable FSG films can be stabilized by annealing or by other post-deposition treatments. However, such methods require additional process steps, equipment, and expense.

For these reasons, what is needed is an improved process for depositing a robust FSG film on a substrate such that the FSG film exhibits, for example, improved chemical, mechanical, and thermal stability without additional processing.

SUMMARY

An improved process for depositing a robust fluorosilicate glass film on a substrate in a chamber includes maintaining a total pressure in the chamber of less than about 1.7 torr, introducing vapor phase chemicals into the chamber, and reacting the vapor-phase chemicals with sufficiently supplied energy to deposit a thin film layer of the fluorosilicate glass on the substrate. In one embodiment, the total pressure in the chamber is about 0.5 torr to about 1.7 torr.

In one embodiment, the vapor-phase chemicals are $N_2$, $SiF_4$, $SiH_4$, and $N_2O$ introduced into the chamber at flow rates, in standard cubic centimeters per minute (sccm), with a ratio of about 1.7:0.5:1:7 to about 17:7:1:70. The energy is supplied as RF energy of frequency about 13.56 MHz at a power density of about 0.4 W/cm$^2$ to about 5 W/cm$^2$, and as RF energy of frequency of about 250 kHz and power density about 0.2 W/cm$^2$ to about 3 W/cm$^2$.

Advantageously, fluorosilicate glass films deposited with the improved process are chemically, mechanically, and thermally stable without additional processing. Also advantageously, the films are deposited uniformly at rates greater than about 5000 Angstroms per minute with dielectric constants of about 3.4 to about 3.9.

DETAILED DESCRIPTION

A process is provided for depositing a low dielectric constant fluorinated silicon glass on a silicon substrate, metal barrier, and/or etch stop layer, which is suitable for use between and around the conductive lines, vias, and other conductors in damascene structures and in other very large scale integration (VLSI) applications.

Figure 1:
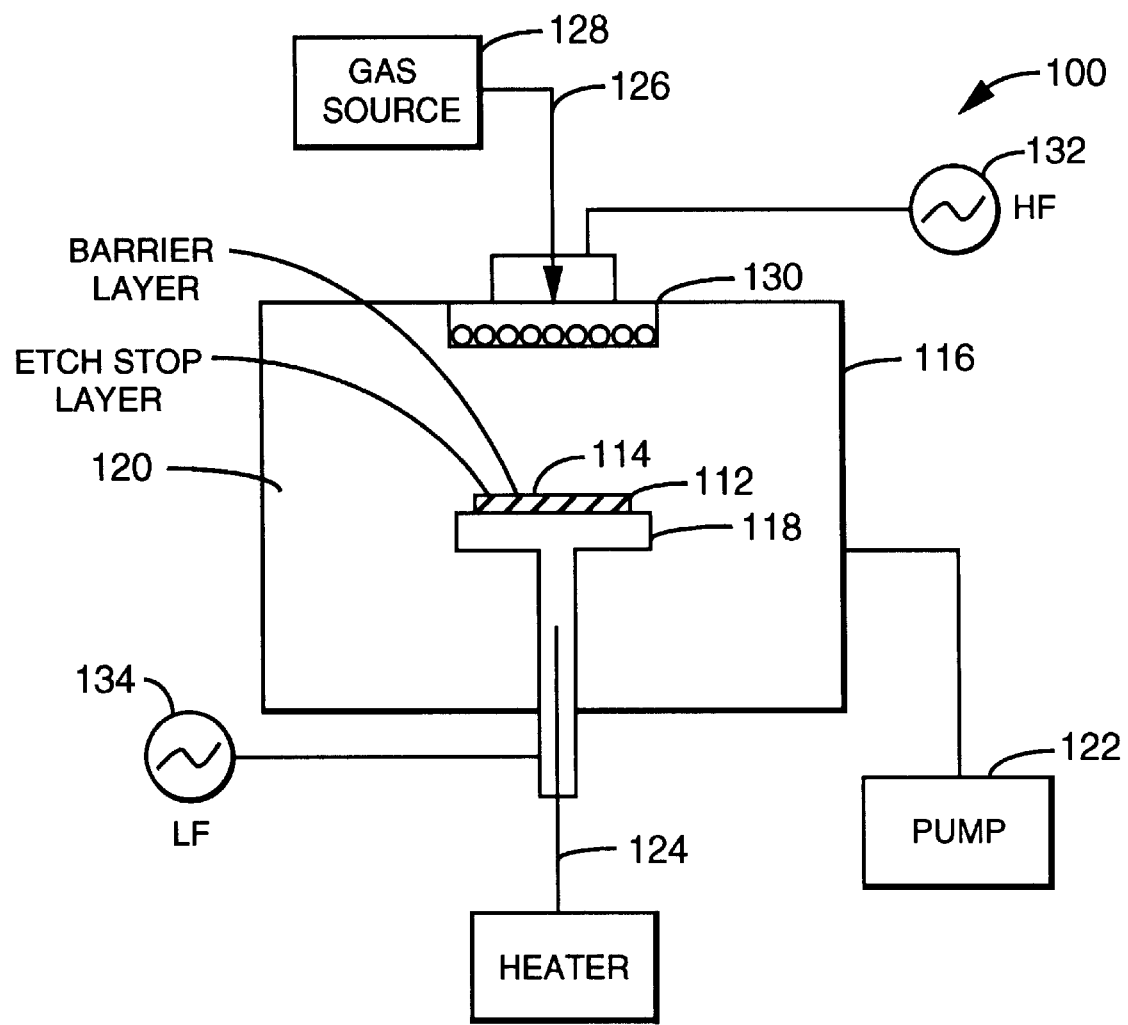
FIG. 1 is a simplified schematic illustration of a chemical vapor deposition device for use in the process of the present invention.

FIG. 1 depicts a simplified schematic illustration of a CVD device 100 for providing a plasma enhanced chemical vapor deposition (PECVD) fluorosilicate film on a substrate 112. Substrate 112 is typically a silicon wafer prepared for receiving an FSG film deposited on an upper surface 114. Other semiconductor substrates are also used. In alternative embodiments, substrate 112 may be a silicon wafer having a metal barrier and/or etch stop layer of silicon oxide, silicon nitride, tantalum nitride, titanium nitride, tungsten nitride, or the like, thereon. Suitable PECVD devices 100 include the PECVD system known as the Concept 2™, Sequel™ or Sequel Express™ manufactured by Novellus Systems, Inc.

Substrate 112 is positioned in chamber 116 on platform 118, which is of a size suitable for holding one or more substrates. As is typical of such chambers, the interior 120 of chamber 116 is evacuated or pressurized as desired by a suitable pump apparatus schematically illustrated by pump 122. Typically, the total pressure in chamber 116 is maintained at less than about 1.7 torr, preferably at about 0.5 torr to about 1.7 torr, more preferably at about 1.5 torr, during deposition of the FSG film. Advantageously, FSG films deposited in these ranges of total pressure are unexpectedly chemically, mechanically, and thermally stable without additional processing.

Platform 118 is heated to a desired temperature by a heating element schematically depicted as heating element 124. Heating element 124 and platform 118 select the temperature of wafer 112 during PECVD processing. Platform 118 is typically heated to a temperature of about 350° C. to about 450° C., preferably 400° C. These platform temperatures correspond to substrate 112 temperatures of about 325° C. to about 425° C., preferably 375° C.

Next, a flow of reactant gases is introduced into the interior 120 of chamber 116 for a predetermined deposition time. Deposition times are typically about 30 seconds to about 200 seconds, depending upon the required film thickness. Selected gases used in PECVD processing are introduced into chamber 116 through a suitable manifold system 126 from various gas supply reservoirs 128. The gases are introduced into the chamber through what is called a shower head 130, which distributes the gases as required. In a preferred embodiment, the gases include a mixture of $N_2$, $SiF_4$, $SiH_4$ and $N_2O$ introduced into the interior 120 of chamber 116 via shower head 130. Other combinations of oxygen, silicon, fluorine, and nitrogen containing source gases are also used. Alternative reactant gases include tetraethoxysilane (TEOS), fluorinated TEOS, $CF_4$, $C_2F_6$, helium, and $O_2$, for example.

The ratio of $N_2$, $SiF_4$, $SiH_4$ and $N_2O$ introduced into chamber 116 is selected to deposit an FSG thin film on substrate 112 by plasma enhanced vapor deposition. The $N_2:SiF_4:SiH_4:N_2O$ flow rate ratios are typically about 1.7:0.5:1:7 to about 17:7:1:70, preferably about 1.7:0.5:1:7 to about 15:5:1:50 more preferably about 8:3:1:33. By way of example, $N_2$ flows into chamber 116 at a rate of about 500 standard cubic centimeters per minute (sccm) to about 5000 sccm, preferably about 500 sccm to about 2500 sccm, more preferably about 2500 sccm. The remaining gas recipe may then be set at flow rates of approximately: $SiF_4$ about 100 sccm to about 2000 sccm, preferably about 300 sccm to about 1200 sccm, more preferably about 900 sccm; $SiH_4$ about 100 sccm to about 900 sccm, preferably about 150 sccm to about 600 sccm, more preferably about 300 sccm; and $N_2O$ about 5000 sccm to about 20,000 sccm, preferably about 8000 sccm to about 14,000 sccm, more preferably about 10,000 sccm, to form the FSG film.

As the gases enter chamber 116, plasma energy is supplied to the chamber through a radio frequency (RF) generator 132 which supplies high-frequency (HF) RF power. Although the industry standard for HF plasma energy used in PECVD chambers is 13.56 (MHz), other high-frequency values may also be used. In one embodiment, suitable plasma power includes HF energy (13.56 MHz) at a power density of about 0.4 watts per square cm ($W/cm^2$) to about 5.0 $W/cm^2$, preferably about 1.0 $W/cm^2$ to about 4.0 $W/cm^2$, of substrate As is known to those skilled in the art of PECVD processing, the plasma energy in chamber 116 ionizes the introduced gases, generating ions and radicals which are deposited on or react with surface 114 of wafer 112 to provide the desired product FSG film. The preferred reactant gases $N_2O$, $SiF_4$, $SiH_4$ and $N_2$ provide discharge of long-life radicals and ions, which include F, N, O, H, and Si. The ions form bonds with Si and/or Si—O within the film.

Chemical vapor deposition device 100 is preferably a dual frequency chamber which also provides a low-frequency (LF) generator 134 for supplying low frequency power to the interior 120 of chamber 116 during FSG film deposition. Supplying low frequency RF power during FSG film deposition typically improves the chemical stability of the deposited FSG thin film. Low-frequency power is supplied between platform 118 and shower frequency RF power, generally in the frequency range of about 100 kHz to about 500 kHz, preferably 250 kHz, typically has a power density of about 0.2 $W/cm^2$ to about 3.0 $W/cm^2$, preferably about 0.5 $W/cm^2$ to about 2.0 $W/cm^2$, of substrate surface.

Process parameters including total pressure, high frequency RF power density, low frequency RF power density, substrate temperature, and reactant gas flow rates were chosen to optimize the deposition rate, the fluorine content, the dielectric constant, the film uniformity, and the chemical, mechanical and thermal stability of the FSG film. Extensive experimentation has resulted in the discovery of a new and unexpected process window for the production of fluorinated silicon glass layers on semiconductor substrates.

In preliminary experiments, all process parameters were varied over wide ranges outside of their conventional values in search of optimal values which provided improved FSG film characteristics. In follow-up experiments, the low frequency (250 kHz) RF power, the $SiF_4$ flow rate, and the total pressure were individually varied while the other process parameters were held constant.

Table 1 summarizes the results of 10 such follow-up experiments, labeled runs 1–10, in which FSG films were deposited on silicon wafer substrates in a Novellus Systems, Inc. Sequel Express ™ PECVD reactor. The results summarized in Table 1 are also displayed graphically in the plots of FIGS. 2–9. Fixed variables in these experiments included: $SiH_4$ flow rate ~300 sccm, $N_2O$ flow rate ~14,000 sccm, $N_2$ flow rate ~2,500 sccm, substrate temperature ~375° C., deposition time ~25 seconds, and high frequency (13.56 MHz) RF power ~1000 Watts. These process parameters were chosen based on the results of the preliminary experiments.

The average thickness and percent uniformity (% U=100%×standard deviation of thickness/average thickness) of each FSG film were measured immediately after film deposition at 49 points in the film, excluding regions of the film within 3 millimeters of a substrate edge, with a Tencor model SM-300 film measurement system available from KLA-Tencor Corporation. The FSG film stress was measured with a Flexus 5200h film stress measurement system, also available from KLA-Tencor Corporation, immediately after deposition and also after a seven day period during which the FSG film was exposed to clean room ambient atmosphere (air). The refractive index (R.I.) of the FSG film, which is correlated with the film dielectric constant, was measured with a Metricon PC2010 prism coupling instrument, available from Metricon Corporation, immediately after deposition and also after a seven day period during which the FSG film was exposed to clean room ambient atmosphere. The change in film stress ($\Delta$stress) and change in film refractive index ($\Delta$R.I.) after seven days of exposure to ambient atmosphere are measures of FSG film mechanical and chemical stability. The percentage of silicon bonds which are Si—F bonds (%Si—F), and the atomic weight percent fluorine in the FSG film, were determined from infrared spectra of the FSG films measured with a conventional Fourier transform infrared spectrometer, and also from Rutherford backscattering spectroscopy.

Figure 2:
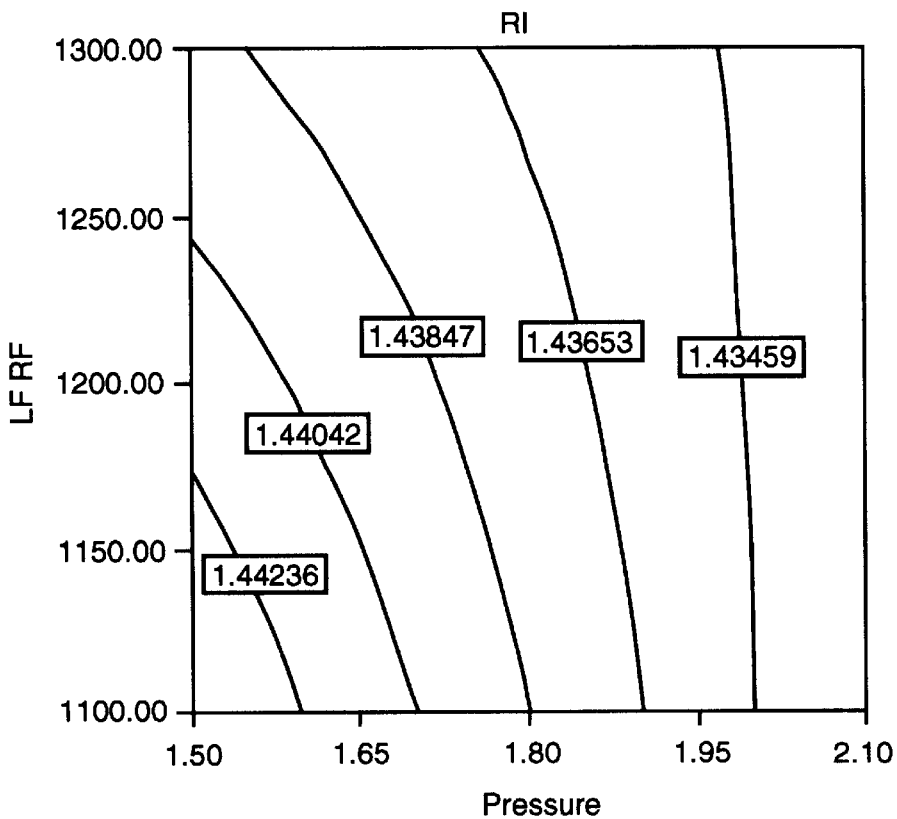
FIG. 2 is a contour plot of FSG film refractive index as a function of low frequency RF power and total pressure.
Figure 3:
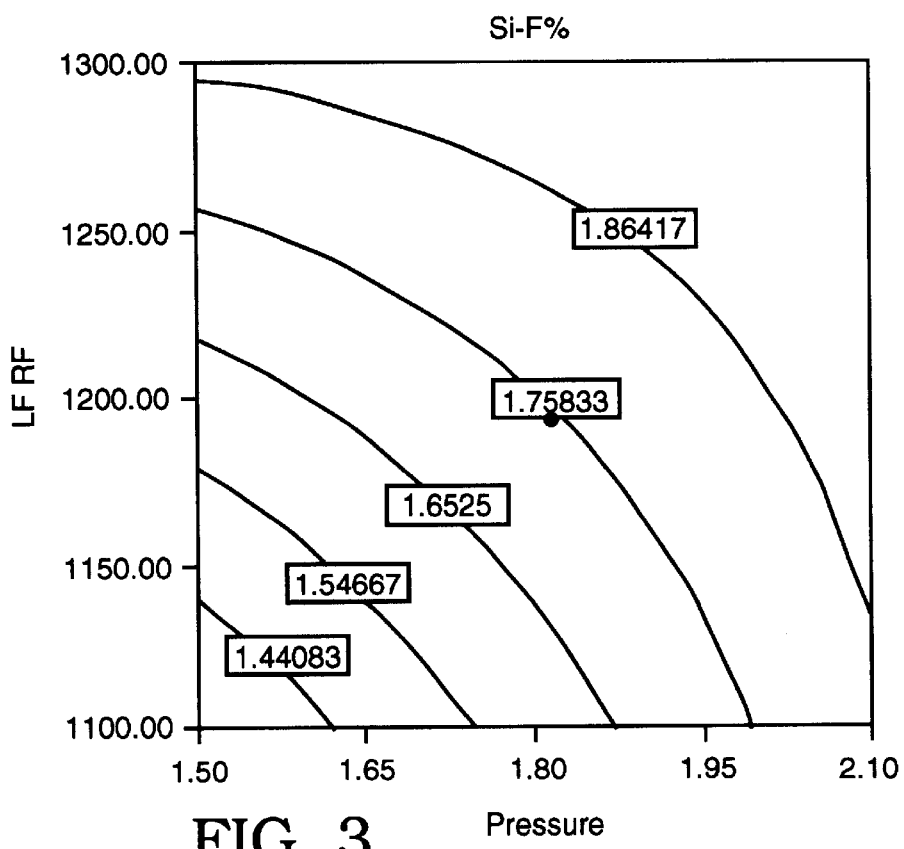
FIG. 3 is a contour plot of FSG film % Si—F bonds as a function of low frequency RF power and total pressure.
Figure 4:
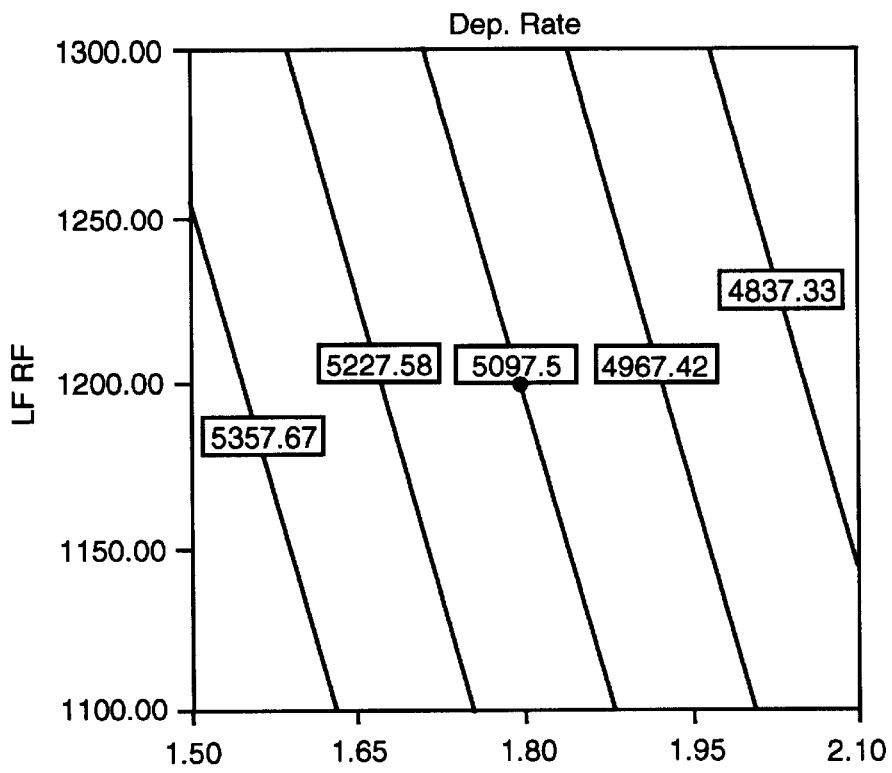
FIG. 4 is a contour plot of FSG film deposition rate as a function of low frequency RF power and total pressure.
Figure 5:
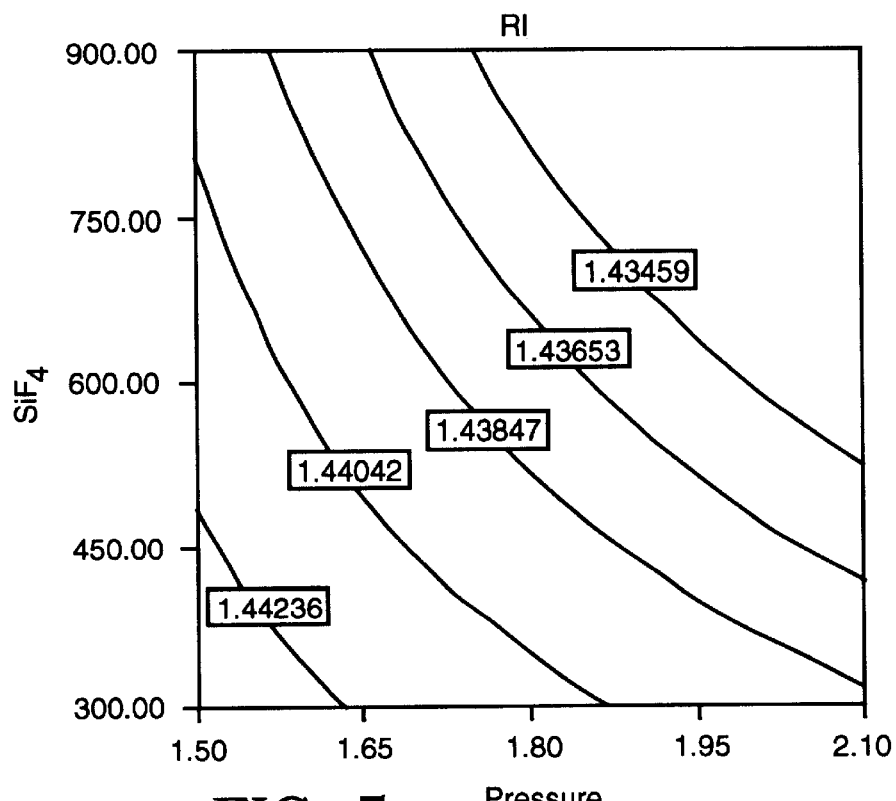
FIG. 5 is a contour plot of FSG film refractive index as a function of $SiF_4$ flow rate and total pressure.
Figure 6:
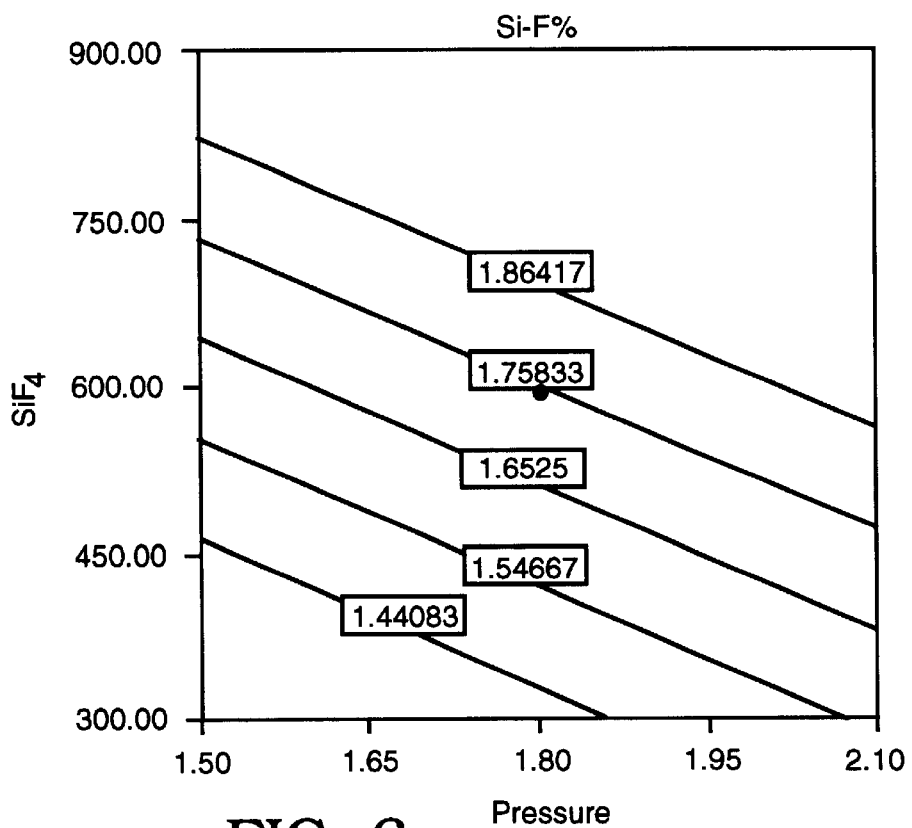
FIG. 6 is a contour plot of FSG film % Si—F bonds as a function of $SiF_4$ flow rate and total pressure.
Figure 7:
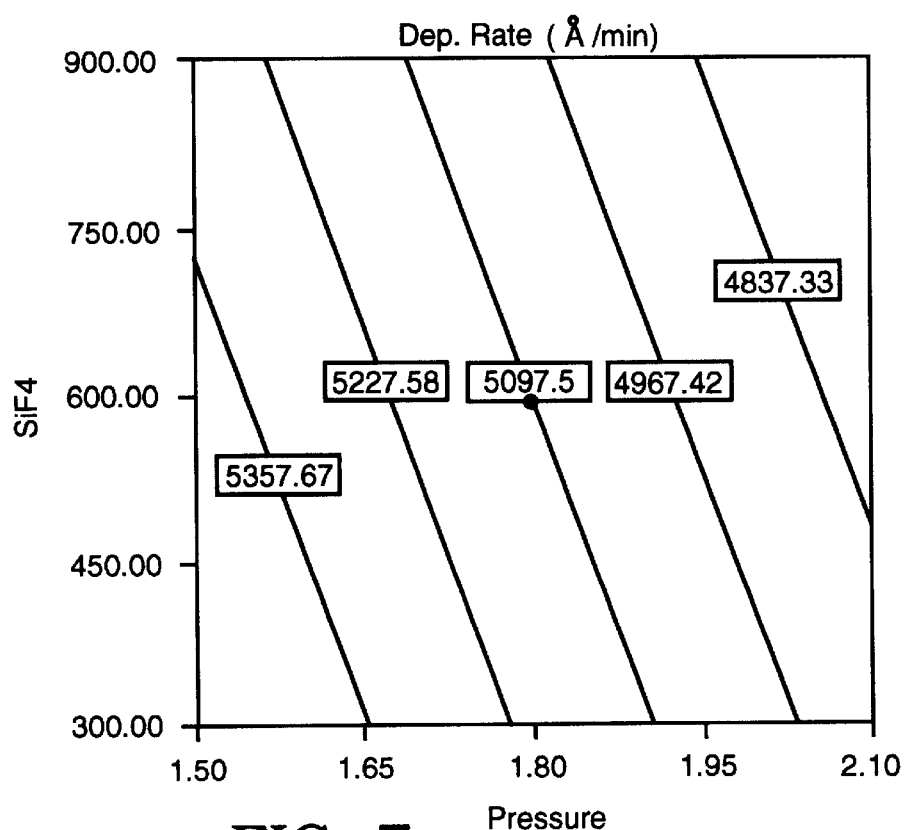
FIG. 7 is a contour plot of FSG film deposition rate as a function of $SiF_4$ flow rate and total pressure.
Figure 8:
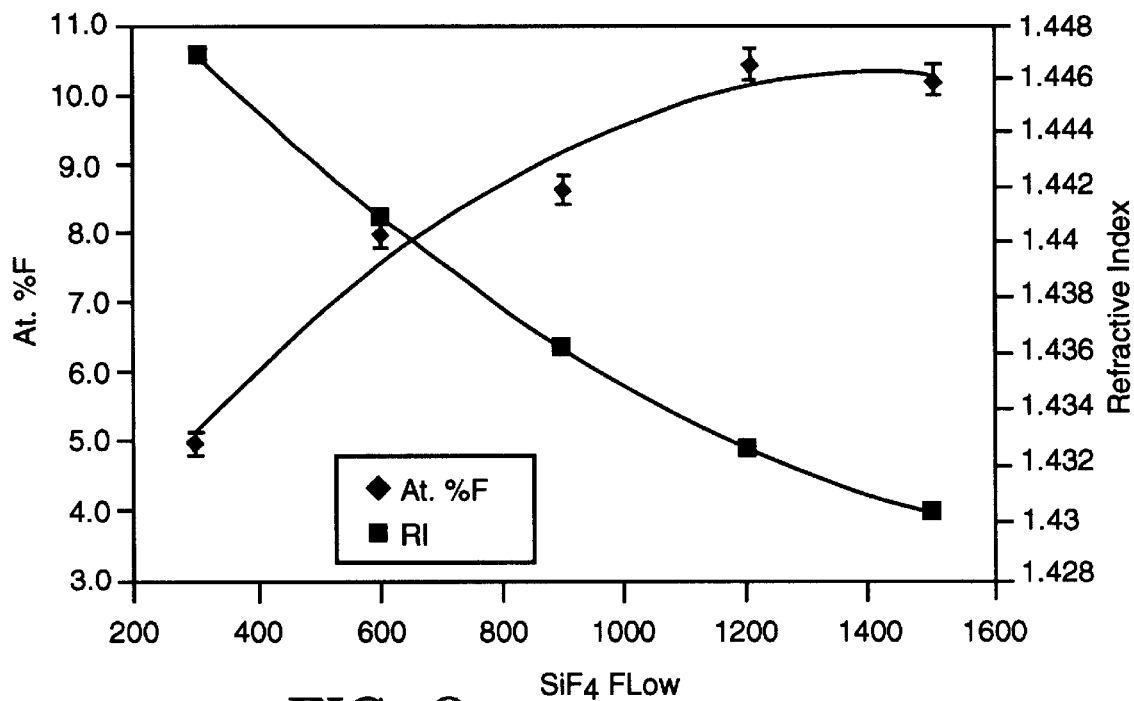
FIG. 8 is a plot of FSG film atomic weight percent fluorine and refractive index versus $SiF_4$ flow rate.
Figure 9:
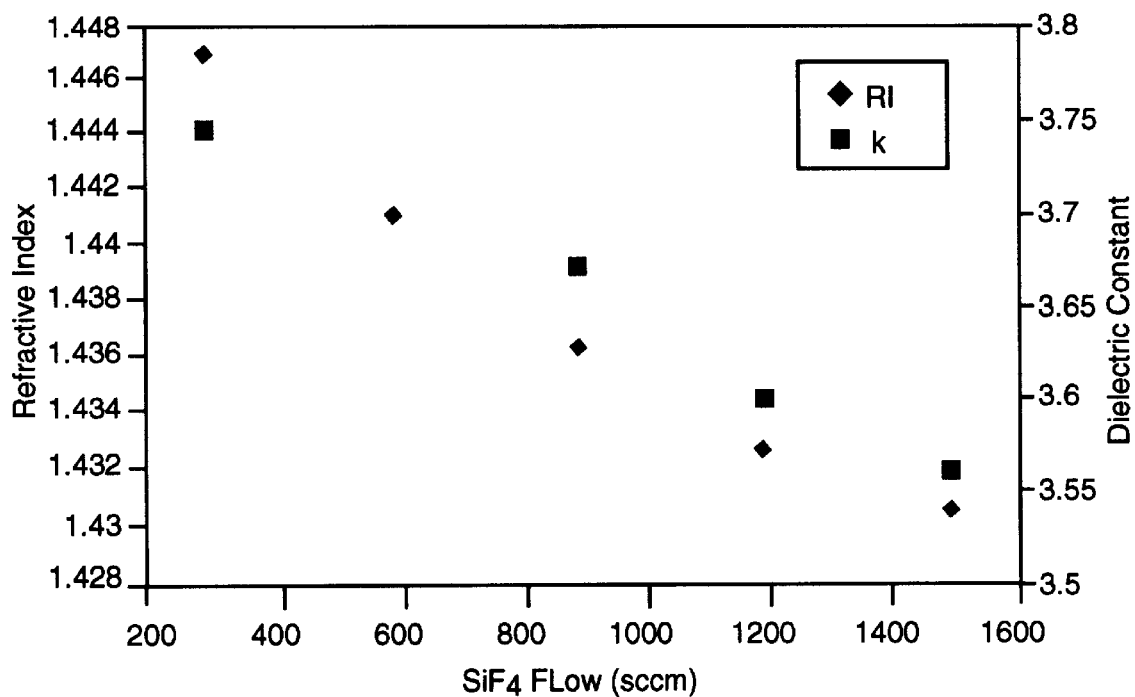
FIG. 9 is a plot of FSG film dielectric constant and refractive index versus $SiF_4$ flow rate.

Inspection of Table 1 and FIGS. 2–4 reveals that variation of low frequency RF power from about 1100 Watts to about 1300 Watts weakly affects the FSG film characteristics. In particular, as the low frequency RF power is increased through this range, the film refractive index decreases, the % Si—F bonds increases, and the film deposition rate decreases. The uniformity of the FSG film, and the chemical and mechanical stability of the FSG film, as measured by $\Delta$stress and $\Delta$R.I., are not strongly correlated with low frequency power in this power range.

Table 1 and FIGS. 5–9 indicate that variation of the $SiF_4$ flow rate from about 300 sccm to about 900 sccm significantly affects some of the FSG film characteristics. In particular, as the $SiF_4$ flow rate is increased through this range, the film refractive index decreases, the % Si—F bonds and the atomic weight percent fluorine increase, the deposition rate decreases, and the film uniformity improves. The chemical and mechanical stability of the FSG film, as measured by $\Delta$stress and $\Delta$R.I., are not strongly correlated with the $SiF_4$ flow rate in this range.

In contrast, variation of the total pressure in the CVD chamber had a dramatic affect on FSG film characteristics. As Table 1 and FIGS. 2–7 indicate, as the total pressure in the CVD chamber is increased from about 1.5 torr to about 2.1 torr, the refractive index decreases, the % Si—F bonds increases, the film deposition rate decreases, and the film uniformity improves. The chemical and mechanical stability of the FSG film, as measured by $\Delta$stress and $\Delta$R.I., are strongly correlated with total pressure. Surprisingly, the chemical and mechanical stability of the FSG films are much worse for films deposited at about 2.1 torr than for films deposited at about 1.5 torr or about 1.8 torr.

TABLE 1

Experiment and Results

| Run | Pres. torr | LF watt | $SiF_4$ sccm | Dep. Rate Å/min | % U | Stress $10^9$ dyne/cm$^2$ | R.I. | % Si—F | $\Delta$ stress $10^9$ dyne/cm$^2$ | $\Delta$ R.I. |
|---|---|---|---|---|---|---|---|---|---|---|
| 1 | 1.5 | 1100 | 300 | 5518 | 1.73 | −2.073 | 1.4498 | 0.79 | −0.017 | 0.0008 |
| 2 | 1.5 | 1100 | 900 | 5436 | 2.2 | −1.797 | 1.4388 | 1.88 | −0.045 | 0.0010 |
| 3 | 1.5 | 1300 | 900 | 5360 | 1.44 | −1.798 | 1.4371 | 2.05 | −0.063 | 0.0015 |
| 4 | 1.8 | 1200 | 600 | 5161 | 1.3 | −1.603 | 1.4366 | 1.83 | −0.001 | 0.0011 |
| 5 | 2.1 | 1100 | 300 | 5097 | 1.23 | −1.293 | 1.4381 | 1.30 | −0.106 | 0.0015 |
| 6 | 1.8 | 1200 | 600 | 5194 | 1.37 | −1.605 | 1.4364 | 1.85 | 0.019 | 0.0013 |
| 7 | 2.1 | 1100 | 900 | 4673 | 1.12 | −1.158 | 1.4272 | 2.39 | −0.126 | 0.0032 |
| 8 | 2.1 | 1300 | 300 | 4860 | 1.47 | −1.445 | 1.4390 | 1.47 | −0.091 | 0.0016 |
| 9 | 2.1 | 1300 | 900 | 4533 | 1.03 | −1.247 | 1.4278 | 2.47 | −0.078 | 0.0028 |
| 10 | 1.5 | 1300 | 600 | 5303 | 1.28 | −1.895 | 1.4409 | 1.70 | −0.037 | 0.0006 |

In addition, the thermal stability of the FSG films produced in experimental runs 1–10 was assessed with an adhesion test. After seven days of exposure to ambient atmosphere, the FSG films were positioned in a CVD apparatus and over-coated with an ~5000 Å thick stack of three dielectric layers with structure silicon nitride layer/silicon oxide layer/silicon nitride layer. The over-coated FSG films were removed from the CVD apparatus and immediately examined under a 10× microscope for blistering. Blisters and bubbles in the overcoat dielectric stack indicate that the FSG film is outgassing and thus unstable at room temperature. Unblistered FSG films were annealed in an oven at a wafer temperature of about 400° C. under about 2.4 torr of nitrogen for approximately nine hours. The FSG films were then reexamined for blisters and bubbles. The results of this adhesion test for the 10 follow-up experiments, labeled runs 1–10 as in Table 1, are summarized in Table 2.

The results of the adhesion test did not strongly correlate with variation of low frequency RF power or $SiF_4$ flow rate. The choice of total pressure, however, dramatically affected the adhesion test results. As Table 2 indicates, FSG films deposited at a pressure of about 2.1 torr (runs 5, 7, 8, and 9) failed the adhesion test by blistering in every case. Two films deposited at about 2.1 torr blistered before annealing. All FSG films deposited at pressures of about 1.5 torr and about 1.8 torr passed the adhesion test.

TABLE 2

Adhesion Test

| Run | Before Anneal | After Anneal |
|---|---|---|
| 1 | clear | clear |
| 2 | clear | clear |
| 3 | clear | clear |
| 4 | clear | clear |
| 5 | clear | 100% blistering |
| 6 | clear | clear |
| 7 | 100% blistering | |
| 8 | clear | 100% blistering |

TABLE 2-continued

Adhesion Test

| Run | Before Anneal | After Anneal |
|-----|---------------|--------------|
| 9   | 100% blistering |            |
| 10  | clear         | clear        |

Figure 10:
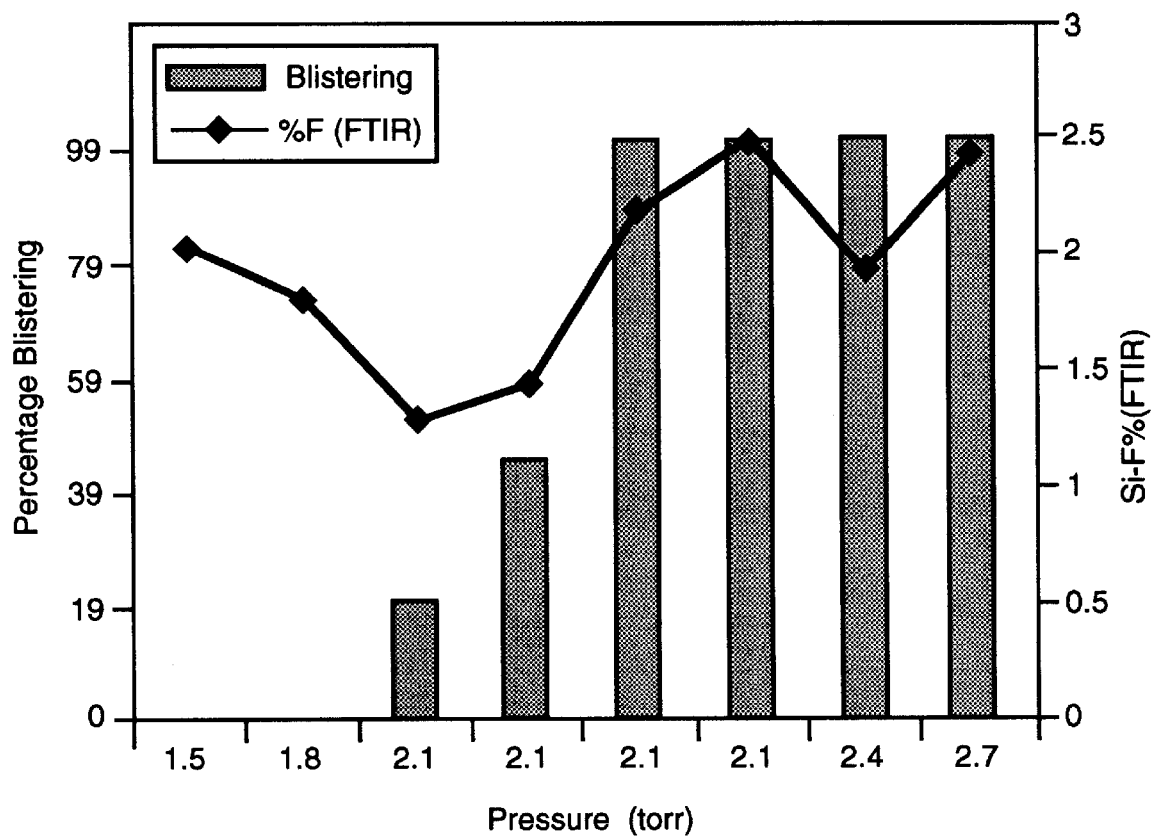
FIG. 10 is a plot of % blistering and % Si—F bonds versus total pressure.

FIG. 10 shows a bar graph of the results of adhesion tests for FSG films deposited at total pressures from about 1.5 torr to about 2.7 torr, with the left vertical axis representing the percentage of the film surface covered with blisters. FSG films deposited at about 1.5 torr and about 1.8 torr had zero blistering. In contrast, FSG films deposited at pressures from about 2.1 torr to about 2.7 torr blistered over about 20% to 100% of their surfaces. Several different results are reported for a pressure of about 2.1 torr, each corresponding to a different $SiF_4$ flow rate, and all blistering.

The results of the adhesion tests and of the $\Delta$stress and $\Delta$R.I. measurements indicate that a special fluorinated silicon glass PECVD process window exists at total pressures below about 2.1 torr. In this process window, for particular choices of RF power densities, gas flow rates, and substrate temperature, fluorinated silicon glass films are deposited with improved chemical, mechanical, and thermal stability without requiring additional processing such as thermal treatments. These stable FSG films have dielectric constants of about 3.4 to about 3.9, experience compressive stress more positive than about $-2.5 \times 10^9$ dyne/cm$^2$, and include fluorine at an atomic weight percent of about 3% to about 11%. Advantageously, these stable FSG films are deposited with a % uniformity less than about 2.5 and at a rate greater than about 5000 Å/minute.

The embodiments of this invention described above are illustrative and not limiting. Many additional embodiments will be apparent to persons skilled in the art from the descriptions herein.

We claim:

1. A process for depositing a fluorosilicate glass on a substrate in a chamber comprising:
   maintaining a total pressure in said chamber of about 1.5 torr to about 1.8 torr;
   introducing vapor phase chemicals into said chamber; and
   reacting said vapor-phase chemicals in said chamber with sufficiently supplied energy to deposit a thin film layer of said fluorosilicate glass on said substrate;
   wherein said sufficiently supplied energy comprises radio frequency energy of a frequency of about 100 kHz to about 500 kHz and further comprises radio frequency energy of a frequency of about 13 MHz.

2. The process of claim 1 further comprising maintaining a temperature of said substrate of about 325° C. to about 425° C. and wherein:
   said sufficiently supplied energy comprises radio frequency energy of a frequency of about 13 MHz and of a power density of about 0.4 W/cm$^2$ to about 5.0 W/cm$^2$ and further wherein
   said sufficiently supplied energy further comprises radio frequency energy of a frequency of about 100 kHz to about 500 kHz and of a power density of about 0.2 W/cm$^2$ to about 3.0 W/cm$^2$.

3. The process of claim 1, wherein said vapor phase chemicals comprise a nitrogen containing gas, a silicon containing gas, a fluorine containing gas, and an oxygen containing gas.

4. The process of claim 1, wherein said vapor phase chemicals comprise $N_2$, $SiF_4$, $SiH_4$, and $N_2O$.

5. The process of claim 4, wherein said $N_2$ is introduced at a flow rate of about 500 sccm to about 5,000 sccm, wherein said $SiF_4$ is introduced at a flow rate of about 100 sccm to about 2,000 sccm, wherein said $SiH_4$ is introduced at a flow rate of about 100 sccm to about 900 sccm, and wherein said $N_2O$ is introduced at a flow rate of about 5,000 sccm to about 20,000 sccm.

6. The process of claim 4, wherein said $N_2$ is introduced at a flow rate of about 500 sccm to about 2,500 sccm, wherein said $SiF_4$ is introduced at a flow rate of about 300 sccm to about 1,200 sccm, wherein said $SiH_4$ is introduced at a flow rate of about 150 sccm to about 600 sccm, and wherein said $N_2O$ is introduced at a flow rate of about 8,000 sccm to about 14,000 sccm.

7. The process of claim 4, wherein said $N_2$ is introduced at a flow rate of about 2500 sccm, wherein said $SiF_4$ is introduced at a flow rate of about 900 sccm, wherein said $SiH_4$ is introduced at a flow rate of about 300 sccm, and wherein said $N_2O$ is introduced at a flow rate of about 10,000 sccm.

8. The process of claim 4, wherein said vapor phase chemicals are introduced into said chamber with a ratio $N_2$:$SiF_4$:$SiH_4$:$N_2O$ of about 1.7:0.5:1:7 to about 17:7:1:70.

9. The process of claim 4, wherein said vapor phase chemicals are introduced into said chamber with a ratio $N_2$:$SiF_4$:$SiH_4$:$N_2O$ of about 1.7:0.5:1:7 to about 15:5:1:50.

10. The process of claim 4, wherein said vapor phase chemicals are introduced into said chamber with a ratio $N_2$:$SiF_4$:$SiH_4$:$N_2O$ of about 8:3:1:33.

11. The process of claim 1 further comprising maintaining a temperature of said substrate of about 325° C. to about 425° C.

12. The process of claim 1 wherein said sufficiently supplied energy comprises radio frequency energy of a frequency of about 13.56 MHz and of a power density of about 0.4 W/cm$^2$ to about 5.0 W/cm$^2$.

13. The process of claim 1 wherein said radio frequency energy of a frequency of about 100 kHz to about 500 kHz is supplied at a power density of about 0.2 W/cm$^2$ to about 3.0 W/cm$^2$.

14. The process of claim 1 further comprising forming a plasma from said vapor phase chemicals.

15. The process of claim 1 wherein said substrate is a silicon wafer.

16. The process of claim 1 wherein said substrate comprises a metal barrier layer of a material selected from the group consisting of silicon oxide, silicon nitride, tantalum nitride, titanium nitride, and tungsten nitride.

17. The process of claim 1 wherein said substrate comprises an etch stop layer of a material selected from the group consisting of silicon oxide, silicon nitride, tantalum nitride, titanium nitride, and tungsten nitride.

18. The process of claim 1 wherein said thin film layer of said fluorosilicate glass has a dielectric constant of about 3.4 to about 3.9.

19. The process of claim 1 wherein said thin film layer of said fluorosilicate glass experiences a stress more positive than about $-2.5 \times 10^9$ dyne/cm$^2$.

20. The process of claim 1 wherein said thin film layer of said fluorosilicate glass comprises about 3% fluorine by weight to about 11% fluorine by weight.

21. The process of claim 1 wherein said thin film layer of said fluorosilicate glass is deposited at a rate greater than about 5000 Angstroms per minute.

22. The process of claim 1 wherein a ratio of a standard deviation of a thickness of said thin film layer and an average thickness of said thin film layer is less than about 0.025.

* * * * *